United States Patent [19]

Young et al.

[11] Patent Number: 5,021,359
[45] Date of Patent: Jun. 4, 1991

[54] RADIATION HARDENED COMPLEMENTARY TRANSISTOR INTEGRATED CIRCUITS

[75] Inventors: William R. Young; Anthony L. Rivoli, both of Palm Bay; William W. Wiles, Jr., West Melbourne, all of Fla.

[73] Assignee: Harris Corporation, Melbourne, Fla.

[21] Appl. No.: 416,419

[22] Filed: Oct. 3, 1989

Related U.S. Application Data

[62] Division of Ser. No. 209,365, Jun. 21, 1988.

[51] Int. Cl.$^5$ .................. H01L 21/265; H01L 29/52; H01L 29/78
[52] U.S. Cl. .................. 437/21; 437/34; 437/62; 437/63; 437/67; 437/938
[58] Field of Search .................. 437/62, 63, 67, 21, 437/34, 57, 938

[56] References Cited

U.S. PATENT DOCUMENTS 4,786,960  11/1988  Jeuch .................. 357/42

FOREIGN PATENT DOCUMENTS 59259152  6/1986  Japan .................. 437/67
62-165356  7/1987  Japan .................. 437/34

OTHER PUBLICATIONS

"Characterization of the Lateral and Vertical Parasitic Transistors in a Trench Isolated CMOS Process", M. C. Roberts, D. J. Foster, pp. 411–412.
"MOSFET Achieved by a Combination of Polysilicon Sidewall and SIMOX Technology", T. Ohno et al., Electronic Letters, pp. 559–560, May 86.

Primary Examiner—Olik Chaudhuri
Assistant Examiner—Andrew Griffis
Attorney, Agent, or Firm—Barnes & Thornburg

[57] ABSTRACT

Integrated circuits with vertical isolated trenches are radiation hardened by providing vertical gate segments, preferably, of doped polycrystalline silicon, in the trenches and connected at the bottom of the trenches to a region of the same conductivity type. The surface devices may be complementary and the vertical gates may also be complementarily doped. A method of fabrication is described for a single crystal wafer, as well as SOI.

12 Claims, 3 Drawing Sheets

RADIATION HARDENED COMPLEMENTARY TRANSISTOR INTEGRATED CIRCUITS

This is a divisional of application Ser. No. 209,365 filed June 21, 1988.

BACKGROUND AND SUMMARY OF THE INVENTION

The present invention relates generally to integrated circuits with vertical trenches, and more specifically to integrated circuits having vertical trenches and complementary devices.

The investigation of parasitic vertical MOS transistors resulting from trench isolated lateral CMOS processes is described in Abstract No. 274, "Characterization of the Lateral and Vertical Parasitic Transistors in a Trench Isolated CMOS Process", M.C. Roberts et al., pp. 411-412. This articles indicates that the parasitic vertical MOS transistors will either not operate because of the voltages of the circuit or can be minimized by appropriate well doping and side wall oxide thickness.

Parasitic MOSFETs have also been investigated in "MOSFET Achieved by a Combination of Polysilicon Sidewall and SIMOX Technology", T. Ohno et al., Electronic Letters, pp 559-560, May, 1986. The multi sidewall isolation layers of SiO2, polysilicon and field SiO2 and bottom isolation by by higher oxygen-doped polysilicon and buried oxide act as shield and traps for radiation induced charges.

The problem is further increased for devices which are subjected to irradiation. Vertical trench and vertical trench in combination with silicon on insulator (SOI) integrated circuits, although having some advantages, have problems of increase in subthreshold leakage currents, threshold voltage shifts, and transconductance degradation by ionizing radiation. For N channel MOSFETs, it is especially important to eliminate the serious problems of increased leakage current caused by side and back or bottom channel conduction due to radiation induced positive charges trapped in the field-silicon dioxide layer and the buried oxide layer, one solution was discussed previously. Another solution is to fill the vertical trenches with a thin gate oxide and polycrystalline silicon semiconductor material and biasing the polycrystalline to turn the parasitic MOS device off. This may be sufficient in a single device conductivity circuit, but in a complementary circuit, wherein N and P devices are included, biasing the polycrystalline to either the positive or negative supply terminal will tend to turn either the parasitic NMOS off and the parasitic PMOS on or vice versa. Thus, this is not a solution for complementary circuitry.

Thus, an object of the invention is to provide radiation hardened integrated circuits including complementary devices.

Another object of the present invention is to provide a method of fabricating an integrated circuit having radiation hardened complementary devices.

An even further object of the present invention is to provide a circuit method of fabricating an integrated circuit having vertical isolation trenches and complementary devices which are radiation hard.

A still further object of the present invention is to provide a circuit and method of fabricating an integrated circuit having complementary devices on a silicon-on-insulator substrate and lateral dielectrical isolation trenches which is radiation hard.

These and other objects of the invention are attained by providing in the lateral trenches vertical gate segments separated from the lateral edge of the trenches by a dielectric gate layer and being connected at the bottom of the trench to doped device region. In a preferred embodiment the vertical gate segments are semiconductor material having the same doping as the doped device region in the bottom or the trench. The trenches are further filled with dielectric isolation to separate the gate segments from each other.

To reduce the parasitic capacitance, the vertical gate segment is provided only between two heavily doped regions of one conductivity type, separated by a lighter doped region of another second conductivity type, where all three regions terminate at the vertical edge of the trench. Although the planar devices described in the specification are directed to CMOS transistors, the invention is applicable to resistors, capacitors or any other device or devices forms of multiple semiconductor regions.

The method of fabrication includes forming the isolation trenches, covering the lateral walls with a dielectric insulative layer, followed by forming vertical semiconductor gate segments which are connected to the silicon at the bottom of the trench. The trenches are then filled with insulative material and planarized. The isolated islands and their adjacent vertical semiconductor gate segments are then doped with common conductivity type impurities. Surface regions of the opposite conductivity type than the previously formed regions are then formed. The dielectric insulative layer and semiconductor gate segments are applied by forming appropriate layers and then selectively removing, for example by reactive ion etching. The dielectric insulative layer at the bottom of the trenches is removed either totally, or selectively, prior to applying the semiconductor layer.

To form semiconductor gate segments only adjacent portions of the trench, the trench formation initially only forms the semiconductor gate segment portions of the trench with subsequent trench formation after the formation of the insulative layer and semiconductor gate regions. Where the substrate includes a buried insulative layer, the initial trench formation terminates prior to reaching the buried region. The removing of the semiconductor layer to form the vertical semiconductor gate portions continues to further increase the depth of the trench down to the buried insulative layer.

Other objects, advantages and novel features of the present invention will become apparent from the following detailed description of the invention when considered in conjunction with the accompanying drawings.

DETAILED DESCRIPTION OF THE DRAWINGS

Figure 1:
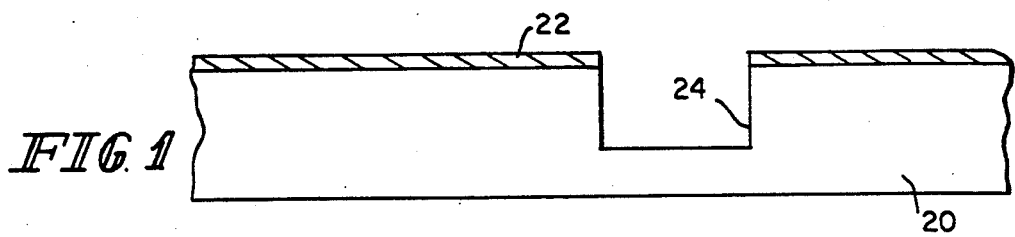
FIGS. 1-10 are cross-sectional views of an integrated circuit at various stages of fabrication according to the principles of the present invention.

The process begins by forming an insulative layer 22 on a substrate 20. The insulative layer 22 is then masked to form an opening defining the trenches. The exposed insulative layer 22 and the underlying portion of the substrate 20 are then removed by, for example reactive ion etching, to form vertical trenches 24 therein. The wafer at this stage of process is illustrated in FIG. 1.

Figure 2:
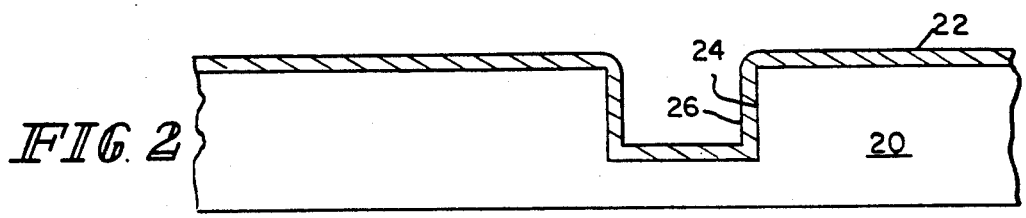
Figure 3:
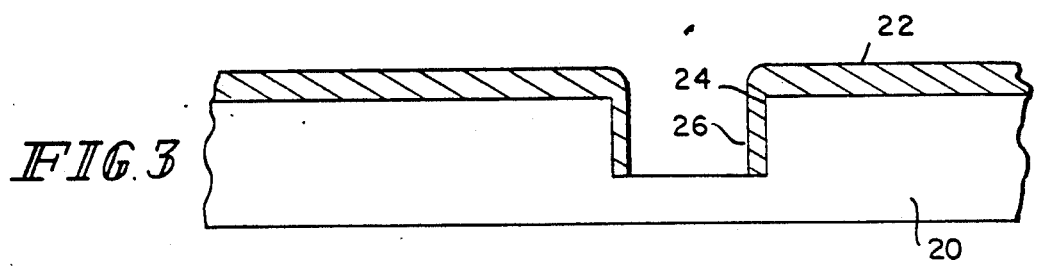

The wafer is then oxidized, forming a layer 26 along the exposed lateral and bottom walls of the trench 24 as illustrated in FIG. 2. The insulative layer 26 is totally removed from the bottom of the trench 24 by, for example, reactive ion etching, as illustrated in FIG. 3.

Figure 4:
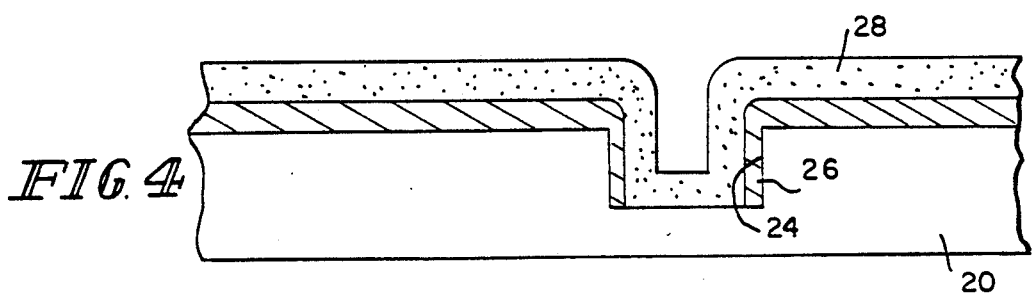
Figure 5:
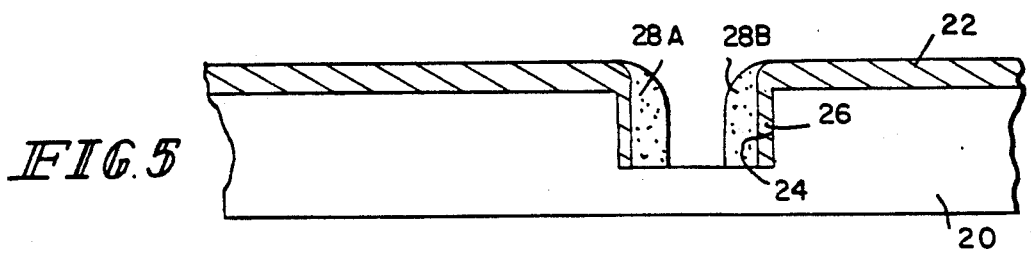

A layer 28 of polycrystalline semiconductor material is then applied to the bottom of the trench 24, the oxide layer 26 covering the walls of the trench 24 and the oxide layer 22 covering the substrate, as illustrated in FIG. 4. The polycrystalline layer 28 is then selectively removed by, for example, reactive ion etching, to leave polycrystalline spacers or gate portions 28A and 28B in the trenches 24 connected at the bottom to the substrate 20, as illustrated in FIG. 5. The layer 28 may be any gate material, for example, single crystal semiconductor, silicides or refractory metal.

Figure 6:
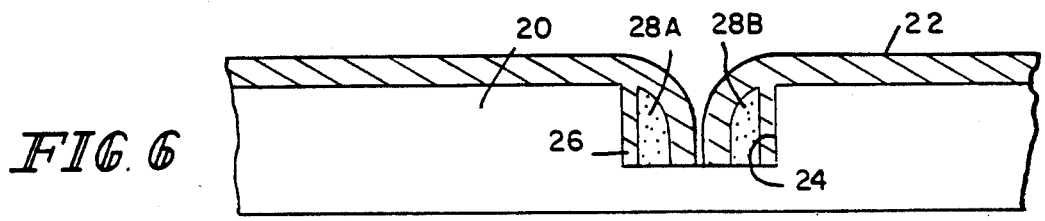
Figure 7:
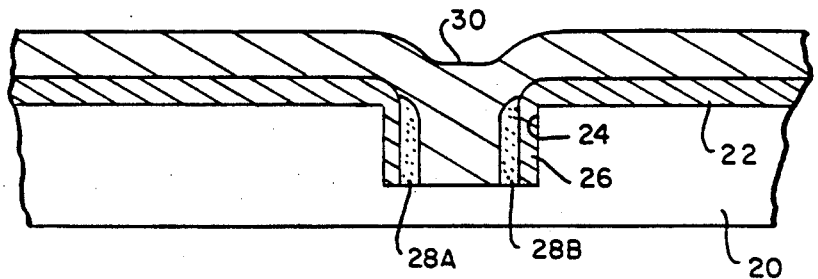

Polycrystalline gate segments 28A and 28B are then oxidized to further cover the exposed surface of the polycrystalline gate segments 28A and 28B, as illustrated in FIG. 6. The trenches are then filled with insulative material 30, as illustrated in FIG. 7, and planarized using well-known methods to produce the planar structure of FIG. 8. The resulting structure forms a plurality of laterally dielectrically isolated islands having adjacent gate segments laterally isolated therefrom by a thin insulative layer 26 yet connected at their bottoms to the substrate 20.

Figure 9:
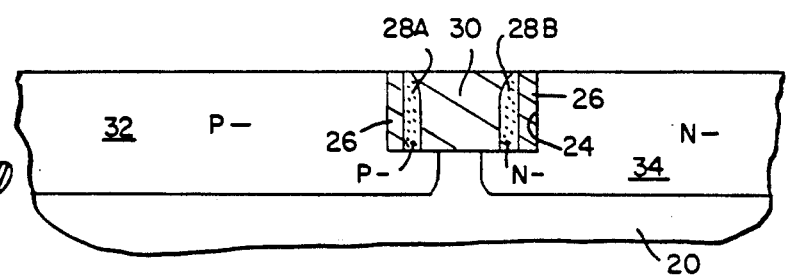
Figure 10:
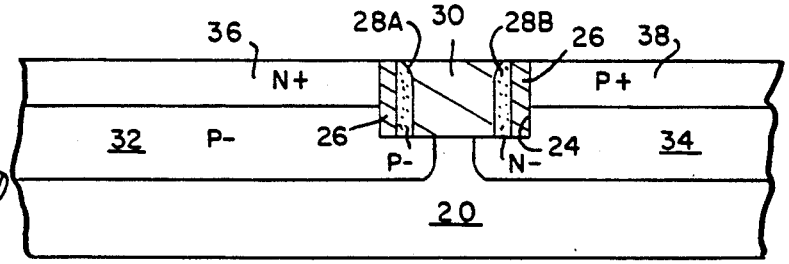
Figure 13:
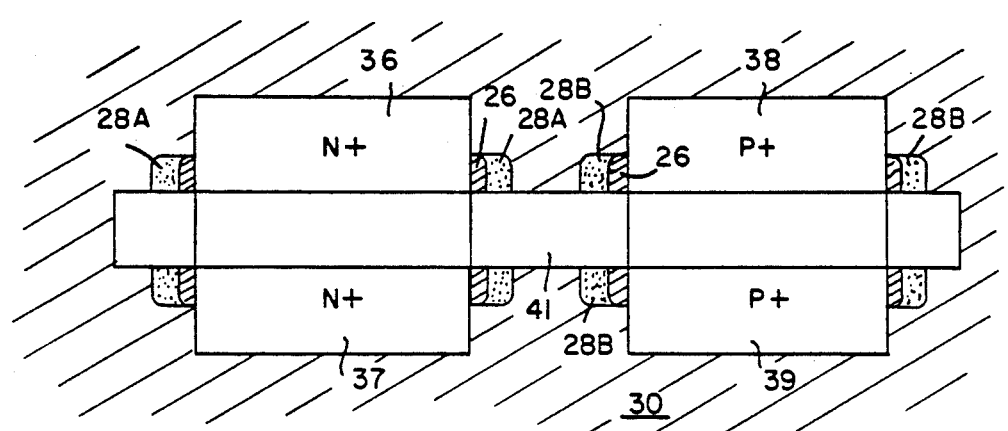
FIG. 13 is a plan view of an integrated circuit showing modified gate segments according to the principles of the present invention.

The wafer is then masked and P type impurities are then selectively introduced to form the P- region 32 and to dope the adjacent polycrystalline gate segment 28A. Next, N type impurities are introduced to form the N region 34 and N dope adjacent gate segment 28B, as illustrated in FIG. 9. N+ type impurities are introduced into region 32 to form N+ source and drain regions 36, 37 and body contact regions in N- region 34 (not shown). P+ impurities are then introduced to form P+ source and drain regions 38, 39 in the N- region 34 and P+ body contact to P- region 32 (not shown), as illustrated in FIG. 10 and FIG. 13. The order of introducing the P and N impurities may be reversed.

As can be seen, the NMOS gate 28A on the sidewall is P type and is connected to the P body 32 and the PMOS gate 28B on the sidewall is N type and is connected to the N body 34. This polycrystalline doping raises the parasitic device threshold voltage because of the ms term and connecting the gate to the body tends to bias the device off. Using polycrystalline silicon for the gates allows the ms term setting, ohmic contact of the body and isolation of the top of the gate by oxidation during subsequent process formation of the normal top side MOS devices.

Figure 8:
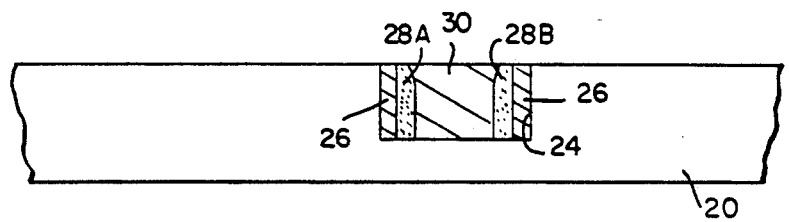
Figure 11:
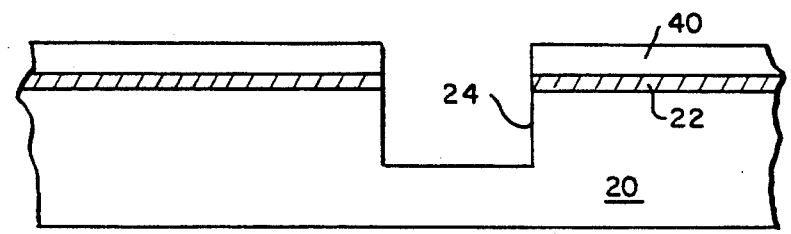
FIG. 11 is a cross-sectional view of a modified step forming a sacrificial layer to be used in planarization.

To aid in the planarization process of FIG. 8, a sacrificial polycrystalline silicon layer 40 may be applied to the first insulative layer 22 on the wafer 20 before forming the trench 24, as illustrated in FIG. 11. The trench 24 is then formed as illustrated in FIG. 1. The polycrystalline sacrificial layer 40 then remains on through the steps illustrated in FIGS. 1-7 and is removed during the planarization process.

Figure 12:
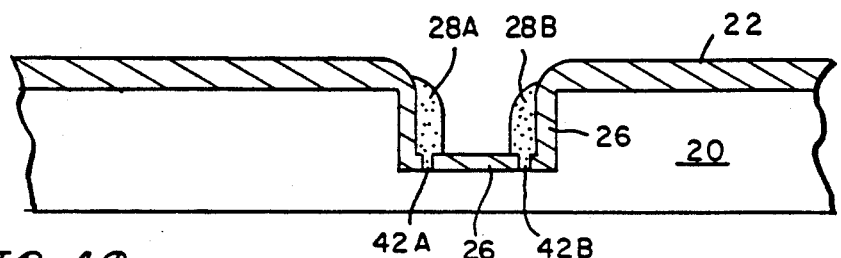
FIG. 12 is a cross-sectional view of a modified step of the method of fabrication illustrating selective removal of the insulative layer in the base of the trench.

As an alternative to the step of FIG. 3, a photoresist material is applied to the wafer of the step of FIG. 2 and patterned to form selective openings 42 in the insulative layer 26 on the bottom of the trench 24. The oxide of the bottom of the trench is then selectively removed to form apertures 42a and 42b exposing the bottom of the trench of the substrate 20. The photoresist material is then removed and the process is continued using the application and removal of the polycrystalline layer 28 of FIGS. 4 and 5. The resulting structure is illustrated in FIG. 12, wherein the gate segments 28A and 28B are connected through apertures 42a and 42b respectively to the substrate 20 at the bottom of the trench 24. By using a photoresist step to selectively remove the insulative layer 26 at the bottom of the trench, an insulative layer 26 is provided under the polycrystalline layer 28 to act as an etch stop during the polycrystalline removal step of FIG. 5. This prevents further etching of the substrate 20 at the exposed base of the trench 24.

If the source/drain parasitic capacitance along the sidewalls between the gate segments 28A and 28B and the source/drain regions 36, 37 and 38, 39 are objectionable, the overlapping of the gate segments 28A and 28B to the source/drain segments 36, 37 and 38, 39 respectively may be reduced. As illustrated in FIG. 13, the vertical gate segments 28A and 28B extend along the lateral edges of the island between the source/drain regions 36, 37 and 38, 39 and minimally overlap the source/drain regions 36, 37 and 38, 39 respectively. Surface gate 41 separates the source and drain regions 36, 37 and source and drain regions 38, 39. The process to form the integrated circuit of FIG. 13 would include selectively forming the trench segments which will include the gate segments 28A and 28B using the processes previously described for FIGS. 1-5 and any alternatives therefor. This will be followed by forming the remaining segments of the trenches, which are along the lateral walls which the source and drain regions 36, 37, 38, 39 intersect. This is followed by the oxidation process of FIG. 6, the filling of the moats with the oxide 30 of FIG. 7 and the planarization of FIG. 8. A device formation is then completed using the steps of FIGS. 9 and 10.

Figure 14:
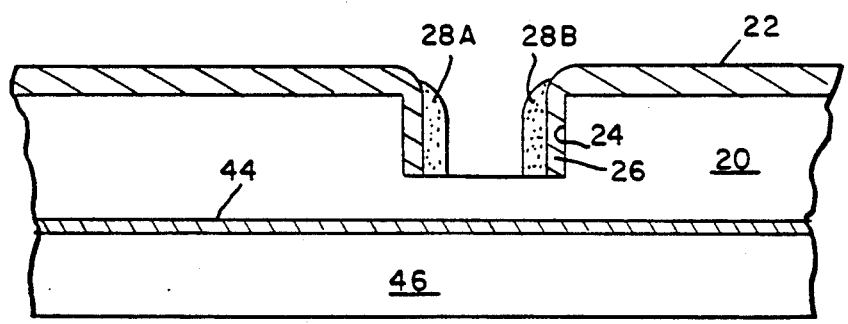
FIGS. 14 and 15 are cross-sectional views of a modified process of FIGS. 1-10 for a substrate formed in a silicon on insulator base.
Figure 15:
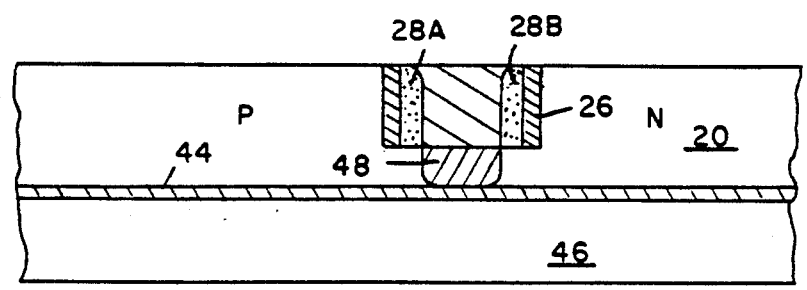

A modification of the previously described process is also applicable to a semiconductor on insulator (SOI) integrated circuits. The semiconductor layer 20 is separated from the semiconductor substrate 46 by a buried insulative layer 44. The trenching process of FIG. 1 is performed to terminate in the semiconductor layer 20 short of the buried region 44. The process steps are then performed up to and including applying the polycrystalline layer 28 of FIG. 4. The removal of the polycrystalline layer to form the gate segments 28A and 28B is conducted by reactive ion etching of FIG. 5 and produces the structure of FIG. 14. Reactive ion etching is then continued to further extend the bottom of the trench where it is not covered by the insulative layer 26 or the polycrystalline gate segments 28A and 28B. It is continued until the buried dielectric layer 44 is reached. The resulting structure is then oxidized using the process of FIG. 6, filled with oxide using the process of FIG. 7, and then planarized to produce the structure of FIG. 15, which is equivalent to FIG. 8. The extended trench portion 48 extends down to the buried insulative layer 44 and has a width determined by the separation of the polysilicon gate segments 28A and 28B.

By connecting the polycrystalline gate segments to the body, the surface contacts to the polycrystalline gate segments are eliminated. This reduces the amount of surface space needed to make these contacts.

Although the present invention has been described for CMOS insulated gate field effect transistors, it is also applicable to single devices, resistors, capacitors, junction field effect transistors of any other device formed by at least two semiconductor regions of one type separated by another semiconductor region of a second type. Although polycrystalline silicon is shown as the vertical gate material, single crystal silicon or any refractor metal or silicide or equivalent thereof can be used.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of fabricating an integrated circuit comprising:
    forming a plurality of trenches in a substrate to form at least first and second laterally separated islands in said substrate;
    forming a first insulative layer along the lateral walls of said trenches;
    forming a semiconductor layer on said first insulative layer, said semiconductor layer being in contact with said substrate at the bottom of said trench;
    filling said trenches with insulative material;
    selectively introducing impurities of a first conductivity type into said first island and an adjacent first portion of said semiconductor layer to form a first region intersecting and underlying a portion of said trench and said first semiconductor layer portion;
    selectively introducing impurities of a second conductivity type into said second island and an adjacent second portion of said semiconductor layer to form a second region intersecting and underlying a portion of said trench and said second semiconductor layer portion;
    selectively introducing second conductivity type impurities into said first region to form a third and a fourth region laterally spaced and intersecting a trench; and
    selectively introducing first conductivity type impurities into said second region to form a fifth and a sixth region laterally spaced and intersecting a trench.

2. A method according to claim 1, wherein forming said first insulative layer includes covering said substrate with said first insulative layer and removing said first insulative layer from the bottom of said trenches.

3. A method according to claim 2, wherein removing comprises reactive ion etching.

4. A method according to claim 1, wherein forming said first insulative layer includes covering said substrate with said first insulative layer and removing selective portions of said first insulative layer from the bottom of said trenches.

5. A method according to claim 4, wherein removing portions of said first insulative layer includes making said first insulative layer and etching exposed selective portions of said first insulative layer.

6. A method according to claim 1, including forming a base insulative layer on said substrate and a top polycrystalline semiconductor material layer on said base insulative layer prior to forming said trenches; and planarizing said substrate to remove said top polycrystalline semiconductor layer after filling said trenches with insulative material.

7. A method according to claim 1, wherein forming said semiconductor layer includes forming a semiconductor layer on said substrate and removing said semiconductor layer from the top of said substrate and from a substantial portion of the bottom of said trenches.

8. A method according to claim 7, wherein said semiconductor layer material is removed and said trenches are formed by reactive ion etching.

9. A method according to claim 1, wherein:
    said substrate includes a buried insulative layer; and
    forming said trenches includes initially forming a trench terminating prior to said buried insulative layer and subsequently extending said trenches down to said buried insulative layer prior to filling said trenches with insulative material.

10. A method according to claim 1, wherein said semiconductor layer extends vertically at least the depth of the substrate defining said third, fourth, fifth and sixth regions and extends laterally at least the width of the substrate defining the first and second regions.

11. A method according to claim 9, wherein:
    forming of said semiconductor layer includes applying a semiconductor layer and simultaneously removing a portion of said semiconductor layer and extending said trenches; and
    said trenches are formed by reactive ion etching.

12. A method according to claim 1, wherein forming said trenches includes:
    initially forming first trench segments in said substrate defining portions of said first and second regions, which separate third, fourth regions and fifth, sixth regions, respectively;
    forming said first insulative layer and said semiconductor layer in said first trench segments; and
    subsequently forming second segment trench segments to form said trenches which form said laterally separated first and second islands.

* * * * *